US010840003B2

(12) United States Patent
Athavale et al.

(10) Patent No.: US 10,840,003 B2
(45) Date of Patent: Nov. 17, 2020

(54) ARRANGEMENT FOR MAINTAINING DESIRED TEMPERATURE CONDITIONS IN AN ENCAPSULATED TRANSFORMER

(71) Applicant: APPLETON GRP LLC, Rosemont, IL (US)

(72) Inventors: Ajit Dilip Athavale, Maharashtra (IN); Dale Charles Corel, Elk Grove Village, IL (US)

(73) Assignee: Appleton Grp LLC, Rosemont, IL (US)

( * ) Notice: Subject to any disclaimer, the term of this patent is extended or adjusted under 35 U.S.C. 154(b) by 134 days.

(21) Appl. No.: 15/522,266

(22) PCT Filed: Sep. 14, 2015

(86) PCT No.: PCT/IB2015/057039

§ 371 (c)(1),
(2) Date: Apr. 26, 2017

(87) PCT Pub. No.: WO2017/046627

PCT Pub. Date: Mar. 23, 2017

(65) Prior Publication Data

US 2017/0330671 A1 Nov. 16, 2017

(51) Int. Cl.

*H01F 27/08* (2006.01)
*H01F 27/22* (2006.01)
(Continued)

(52) U.S. Cl.

CPC ........... *H01F 27/22* (2013.01); *H01F 27/025* (2013.01); *H01F 27/24* (2013.01); *H01F 27/28* (2013.01); *H01F 27/327* (2013.01)

(58) Field of Classification Search

USPC .......................................................... 336/61
See application file for complete search history.

(56) References Cited

U.S. PATENT DOCUMENTS 3,091,722 A * 5/1963 Rusiniak ................ H05K 5/067 361/699
3,372,325 A * 3/1968 Wahlgren ................ H01F 27/40 361/676

(Continued)

FOREIGN PATENT DOCUMENTS

CA 2 461 276 A1 4/2003
CN 203397873 U * 1/2014

(Continued)

OTHER PUBLICATIONS

PCT International Search Report and Written Opinion, PCT International Application No. PCT/IB2015/057039, dated Mar. 18, 2016, 8 pages.

*Primary Examiner* — Alexander Talpalatski
*Assistant Examiner* — Joselito S. Baisa
(74) *Attorney, Agent, or Firm* — McDonnell Boehnen Hulbert & Berghoff LLP

(57) ABSTRACT

The present disclosure envisages an arrangement for maintaining desired temperature conditions on and within a transformer housing of an encapsulated transformer. The arrangement comprises at least one insulation plate disposed proximal to a transformer core and coil assembly of the encapsulated transformer such that the insulating element is in surface contact with a potting compound of the encapsulated transformer and adapted to substantially contain the heat emanating from the transformer core and coil assembly, thereby maintaining desired temperature conditions on and within the transformer housing.

10 Claims, 3 Drawing Sheets

(51) Int. Cl.
*H01F 27/02* (2006.01)
*H01F 27/32* (2006.01)
*H01F 27/24* (2006.01)
*H01F 27/28* (2006.01)

(56) References Cited

U.S. PATENT DOCUMENTS

| | | | | | |
|---|---|---|---|---|---|
| 3,388,299 | A * | 6/1968 | Brideweser | H01F 27/06 | 361/623 |
| 3,553,621 | A * | 1/1971 | Lane | H01F 5/04 | 310/194 |
| 3,564,386 | A * | 2/1971 | Leonard | H02M 7/10 | 363/141 |
| 3,569,885 | A * | 3/1971 | Hilgers | H01F 27/022 | 336/96 |
| 3,600,636 | A * | 8/1971 | Petersen | H01F 27/40 | 361/689 |
| 3,792,338 | A * | 2/1974 | Barthelemy | H01F 27/12 | 361/677 |
| 3,947,795 | A * | 3/1976 | Donnelly | H01F 27/306 | 336/184 |
| 3,949,675 | A * | 4/1976 | Luke | F42C 9/18 | 102/236 |
| 3,959,675 | A * | 5/1976 | Lautner | H02K 3/524 | 310/680 |
| 4,026,862 | A * | 5/1977 | Smith | C08G 59/145 | 174/110 E |
| 4,091,439 | A * | 5/1978 | Blair, Jr. | H01F 27/02 | 361/623 |
| 4,429,347 | A * | 1/1984 | Seitz | H05K 7/02 | 361/677 |
| 4,766,406 | A * | 8/1988 | Kurgan | H01F 5/04 | 174/DIG. 2 |
| 5,742,489 | A * | 4/1998 | Riesland | H01F 27/02 | 361/836 |
| 5,847,939 | A * | 12/1998 | Cotton | H01H 9/0044 | 361/836 |
| 6,094,124 | A * | 7/2000 | Lee | H01F 38/10 | 336/210 |
| 6,246,309 | B1 * | 6/2001 | Heinz | H01F 7/06 | 335/278 |
| 8,456,814 | B2 * | 6/2013 | Gerovac | H02B 1/301 | 361/679.01 |
| 2006/0250683 | A1 | 11/2006 | Balan | | |
| 2009/0017275 | A1 * | 1/2009 | Lee | B82Y 10/00 | 428/201 |
| 2013/0182478 | A1 * | 7/2013 | Nomura | H01F 27/022 | 363/123 |
| 2015/0188297 | A1 * | 7/2015 | Boe | H01F 27/14 | 174/564 |

FOREIGN PATENT DOCUMENTS

| | | | | |
|---|---|---|---|---|
| CN | 104835634 | A * | 8/2015 | |
| JP | 56058215 | A * | 5/1981 | H01F 38/08 |
| WO | 91/14275 | | 9/1991 | |
| WO | 2009/104197 | A1 | 8/2009 | |

* cited by examiner

ARRANGEMENT FOR MAINTAINING DESIRED TEMPERATURE CONDITIONS IN AN ENCAPSULATED TRANSFORMER

CROSS REFERENCE TO RELATED APPLICATIONS

The present application is a national stage entry of PCT/IB2015/057039, filed Sept. 14, 2015, which is incorporated herein by reference for all purposes.

FIELD

The present disclosure relates to the field of mechanical engineering. In particular, the present disclosure relates to encapsulated transformers.

BACKGROUND

Encapsulated or potted transformers are used in hazardous locations and harsh industrial environments. An encapsulated transformer is a standard transformer that is encased in a potting material within a transformer enclosure. The potting material is generally a mixture of sand and resin. The product requirements of the encapsulated transformer state that the temperature rise within the wiring compartment of the transformer should typically not exceed 35° C. and the enclosure temperature rise should typically not exceed 65° C. In order to achieve the above criteria, the conventional encapsulated transformers rely on potting material. More specifically, the amount of potting material used is increased to achieve a desired temperature gradient within the encapsulated transformer. The use of relatively larger quantity of potting material increases the cost and size of the encapsulated transformer.

Hence, in order to overcome the above mentioned drawbacks associated with the conventional encapsulated transformers, there is need for an arrangement for maintaining desired temperature conditions in an encapsulated transformer with less quantity of potting material, and consequently, making the transformer relatively less expensive and less bulky.

Objects

Some of the objects of the present disclosure, which at least one embodiment herein satisfies, are as follows.

It is an object of the present disclosure to ameliorate one or more problems of the prior art or to at least provide a useful alternative.

An object of the present disclosure is to provide an arrangement for maintaining desired temperature conditions in an encapsulated transformer that is cost-effective.

Another object of the present disclosure is to provide an arrangement for maintaining desired temperature conditions in an encapsulated transformer that is not bulky and does not require the use of extra potting material Other objects and advantages of the present disclosure will be more apparent from the following description, which is not intended to limit the scope of the present disclosure.

SUMMARY

The present disclosure envisages an arrangement for maintaining desired temperature conditions on and within a transformer housing of an encapsulated transformer. The arrangement comprises at least one insulation plate disposed within the housing, proximal to a transformer core and coil assembly of the encapsulated transformer such that the insulating plate is either partially or wholly embedded in the potting material or abuts the potting material, so as to contain the heat emanating from the transformer core and coil assembly.

Typically, the material of the insulation plate is one of press-board sheet, epoxy resin, bamboo, paper, polymeric material, bakelite, ceramic, fabric, and a combination of these materials. The insulation plate may provide insulation against heat and/or electricity.

In an embodiment, the encapsulated transformer includes a plurality of temperature sensors disposed on and within the transformer housing.

Typically, the temperature sensors are thermocouples.

Preferably, the potting compound is a mixture of sand and a resin.

In an embodiment, the transformer housing comprises an operative upper chamber and an operative lower chamber, said operative lower chamber configured to house a potted transformer core and coil assembly, and said operative upper chamber configured to house terminals mounted on a terminal plate and wires extending from said transformer core and coil assembly, and an insulation plate disposed at a location forming a junction between said upper chamber and said lower chamber, and being spaced apart from said terminal plate.

Typically, the terminal plate is of steel or aluminium or is a composite.

BRIEF DESCRIPTION OF ACCOMPANYING DRAWINGS

An arrangement for maintaining desired temperature conditions in an encapsulated transformer of the present disclosure will now be described with the help of accompanying drawings, in which.

DETAILED DESCRIPTION

The disclosure will now be described with reference to the accompanying embodiments which do not limit the scope and ambit of the disclosure. The description provided is purely by way of example and illustration.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

The product requirements of an encapsulated transformer state that the temperature rise in the wiring compartment of the encapsulated transformer should not exceed 35° C., and the temperature rise on the walls of housing of the encapsulated transformer should not exceed 65° C. In order to achieve the desired temperature gradient, the conventional encapsulated transformers rely on the additional usage of the potting compound, which is generally epoxy resin. However, this results in an increased size of the encapsulated transformer. Furthermore, the additional usage of the potting compound also has a detrimental impact on the cost-effectiveness of the encapsulated transformer.

The present disclosure envisages an arrangement for maintaining desired temperature conditions in an encapsulated transformer. The use of the arrangement disclosed in the present disclosure results in a cost-effective product along with a reduced size thereof.

Figure 1:
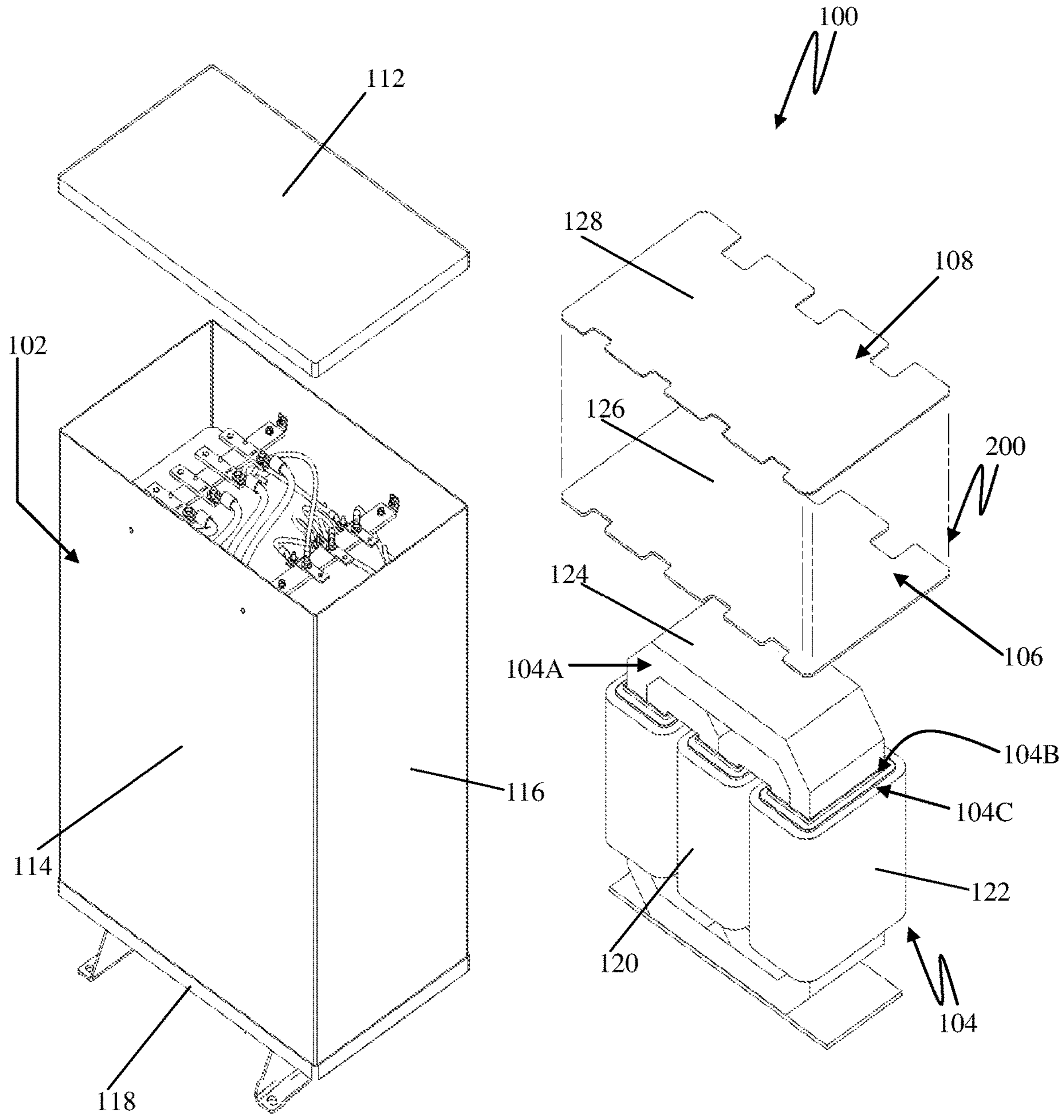
FIG. 1 illustrates exploded isometric views of an encapsulated transformer, in accordance with the present disclosure.

FIG. 1 illustrates exploded isometric views of an encapsulated transformer 100. The encapsulated transformer 100 is defined by a transformer housing 102. The transformer core and coil assembly 104 comprises a core 104A on which the primary windings 104B and secondary windings 104C are wound. In an assembled configuration, the transformer core and coil assembly 104 is disposed within the transformer housing 102 and a potting compound is poured therein to encapsulate the transformer core and coil assembly 104. In an embodiment, the potting compound is a mixture of resin and sand. In accordance with the present disclosure, insulation plates 106 are disposed at various locations proximal to the transformer core and coil assembly 104 within the transformer housing 102 such that the insulation plates 106 are either partially or wholly embedded in the potting compound or abuts the potting compound, so as to contain the heat emanating from the transformer core and coil assembly 104.

In an embodiment, the transformer housing 102 comprises an operative upper chamber 102A and an operative lower chamber 102B. The operative lower chamber 102B is configured to house the potted transformer core and coil assembly 104, and the operative upper chamber 102A is configured to house terminals, mounted on a terminal plate 109, and wires extending from the transformer core and coil assembly 104. An insulation plate 106 is disposed at a location forming a junction between the operative upper chamber 102A and the operative lower chamber 102B. A metal plate 108 is disposed within the operative upper chamber 102A of the transformer housing 102 and spaced apart from the insulation plate 106, which defines a wiring compartment 110 in the operative upper chamber 102A of the transformer housing 102. The metal plate 108 is of steel or aluminium or a composite thereof. The wiring compartment 110 houses terminals of the encapsulate transformer 100 mounted on a terminal plate 109 (seen in FIG. 3) and the wires extending from the transformer core and coil assembly 104 of the encapsulated transformer 100.

Figure 2:
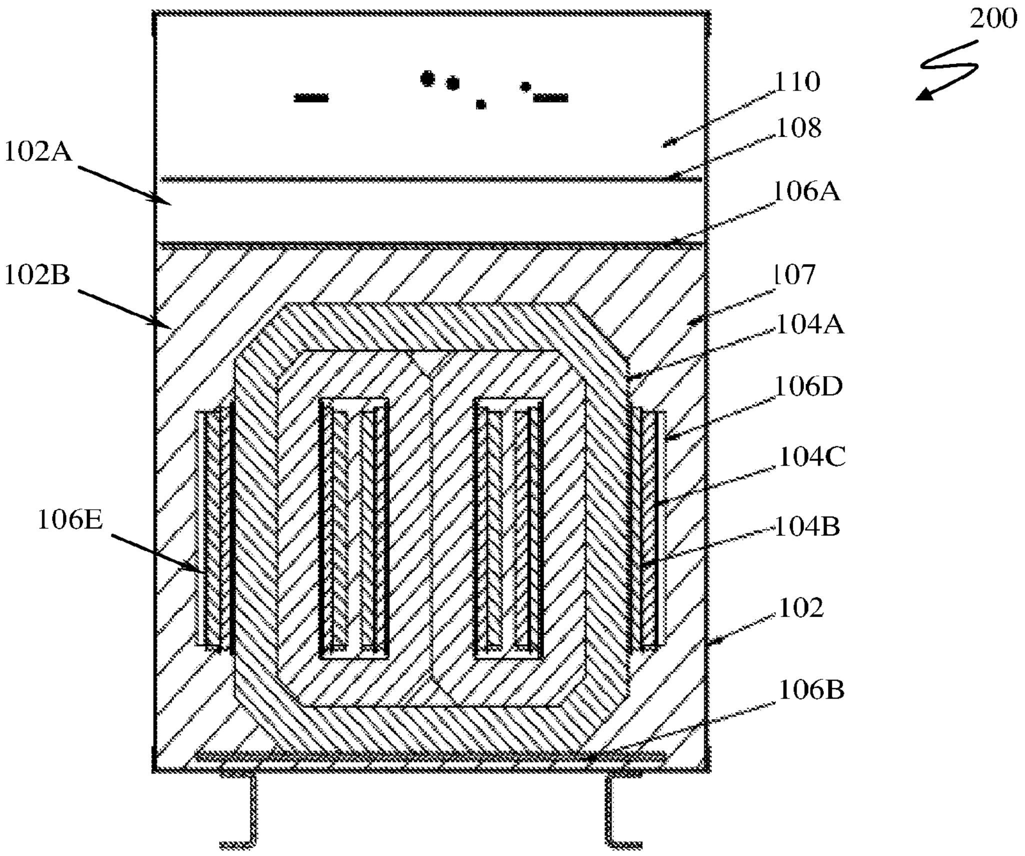
FIG. 2 illustrates a sectional front view of the encapsulated transformer having an arrangement for maintaining desired temperature conditions within the encapsulated transformer, in accordance with an embodiment of the present disclosure.
Figure 3:
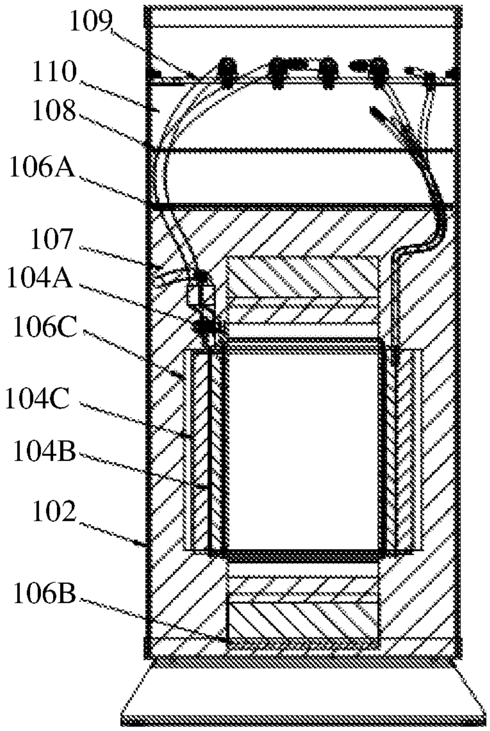
FIG. 3 illustrates a sectional side view of the encapsulated transformer of FIG. 2.

FIG. 2 and FIG. 3 illustrate sectional views of the encapsulated transformer 100 having an arrangement for maintaining desired temperature conditions within the encapsulated transformer (hereinafter referred to as arrangement 200), in accordance with an embodiment of the present disclosure. The arrangement 200 is now described with reference to FIG. 1, FIG. 2, and FIG. 3. The arrangement 200 comprises at least one insulation plate 106 that is disposed proximal to the transformer core and coil assembly 104 such that the insulation plate 106 is either partially or wholly embedded within the potting compound 107 or abuts the potting compound 107. The insulation plate 106 is adapted to substantially contain the heat emanating for the transformer core and coil assembly 104 during the course of operation thereof, thereby maintaining desired temperature conditions on and within the transformer housing 102. In an embodiment, the insulation plates 106 are insulation plates of a material selected from a group consisting of fiberglass, epoxy resin, bamboo, press-board paper, polymeric material, bakelite, ceramic, fabric, and a combination of these materials. For a press-board paper insulation plate, the thickness ranges from 3 mm to 13 mm. In accordance with the present disclosure, the thermal conductivity of the insulation plate ranges from 0.094 to 0.172 W/m/K.

In the embodiment, as seen in FIG. 2 and FIG. 3, the arrangement 200 comprises a top insulation plate 106A disposed at a location forming a junction between the operative upper chamber 102A and the operative lower chamber 102B, a bottom insulation plate 106B disposed operatively below the transformer core and coil assembly 104, a front insulation plate 106C, and side insulation plates 106D, 106E. The use of the insulation plates facilitates a substantial containment of the heat emanating from the transformer core and coil assembly 104 within the potting compound 107 and the insulation plates. Due to this additional insulation, a substantially reduced amount of heat is transmitted to the walls of the transformer housing 102. The result of this is a reduced temperature rise on the walls of the transformer housing 102, without the usage of the additional potting compound, as was the case with the conventional encapsulated transformers. The locations of the insulation plates in not limited to those disclosed in FIG. 2 and FIG. 3. The insulation plates can be installed at various locations within the transformer housing 102 to maintain the desired temperature at various locations.

As explained previously, the metal plate 108 defines a wiring compartment 110 in the operative upper chamber 102A of the transformer housing 102. The wiring compartment 110 houses the terminals of the encapsulated transformer 100 mounted on the terminal plate 109 and wires extending from the transformer core and coil assembly 104. The product requirement of the encapsulated transformer state that the temperature rise within the wiring compartment 110 should not exceed 35° C. To this end, the top insulation plate 106A is disposed operatively above the transformer core and coil assembly 104. In an embodiment, the top insulation plate 106A is disposed such that it is submerged and encapsulated by the potting compound to ensure proper placement thereof. The metal plate 108, defining the wiring compartment 110, is disposed in the operative upper chamber 102A of the transformer housing 102, spaced apart from the top insulation plate 106A. As such, the heat emanated from the transformer core and coil assembly 104 is substantially contained by the potting compound and the top insulation plate 106A, and the heat being transmitted to the metal plate 108 is substantially reduced due to the effect of insulation plates as well as the presence of air gap between the insulation plate 106A and the metal plate 108. The result of this being that the temperature rise within the wiring compartment does not exceed 35° C.

The arrangement 200 further comprises a plurality of temperature sensors 112, . . . , 128. The positions of the temperature sensors 112, . . . , 128 are illustrated in FIG. 1. The temperature sensors 112, . . . , 128 facilitate the monitoring of the temperature changes at various locations on and within the transformer housing 102 of the encapsulated transformer 100. In an embodiment, the temperature sensors 112, . . . , 128 are thermocouples. In another embodiment, the temperature sensors 112, . . . , 128 are thermistors. The number of the temperature sensors 112, . . . , 128, as disclosed in the present embodiment, is nine. However, the number of the temperature sensors 112, . . . , 128 is not limited to nine, and can either be less than or greater than nine, depending on the application requirements.

In an experimental implementation, wherein the pressboard paper insulation plates having thickness 9.525 mm, and thermal conductivity 0.1625 W/m/K, were used, the temperature at different locations were measured via the temperature sensors 112, . . . , 128. The locations of the temperature sensors 112, . . . , 128 are seen in FIG. 1. Table 1 illustrates the values of the temperature obtained in the encapsulated transformer 100 having the arrangement 200 compared with the temperature of the encapsulated transformer without the arrangement 200.

TABLE 1

| Temperature sensor location | Temperature Rise in the transformer without the use of insulation plates(° C.) | Temperature Rise in the transformer with the use of insulation plates (° C.) | Temperature rise Limit (° C.) |
|---|---|---|---|
| 128 | 57 | 35 | 35 |
| 118 | 73 | 54 | 65 |
| 116 | 48 | 43 | 45 |

Thus, it can be seen from the Table 1 that the arrangement 200 of the present disclosure facilitates the obtainment of the temperature conditions, at various locations on the transformer housing 102, which do not exceed the temperature limits specified in the product requirements of the encapsulated transformer.

Thus, the arrangement for maintaining desired temperature conditions in an encapsulated transformer of the present disclosure facilitates a reduced usage of the potting compound in the encapsulated transformer by the use of the insulation plates. The reduced usage of the potting compound results in the reduced size of the encapsulated transformer. Furthermore, the reduced usage of the potting compound also results in the reduced cost of the encapsulated transformer.

Technical Advances and Economical Significance

The arrangement for maintaining desired temperature conditions in an encapsulated transformer of the present disclosure described herein above has several technical advantages including, but not limited to, the realization of an arrangement for maintaining desired temperature conditions in an encapsulated transformer:

such that the encapsulated transformer has reduced usage of the potting material;

such that the encapsulated transformer that has reduced size; and that is cost-effective.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. An arrangement for maintaining desired temperature conditions on and within a transformer housing of an encapsulated transformer, said arrangement comprising:

the transformer housing having a top wall, a bottom wall, and sidewalls extending between the top wall and the bottom wall;

a first insulation plate horizontally disposed within the housing, above a transformer core and coil assembly of the encapsulated transformer such that the first insulation plate is either partially or wholly embedded in a potting material or abuts the potting material, so as to contain heat emanating from the transformer core and coil assembly;

a metal plate extending horizontally from one sidewall to an oppositely disposed sidewall; the metal plate positioned above the first insulation plate forming a first horizontally extending air gap between the metal plate and the first insulation plate;

wherein a wiring compartment is formed between the metal plate and the top wall of the transformer housing, wherein the wiring compartment is positioned above the first air gap;

wherein a horizontally extending terminal plate is disposed within said wiring compartment between the metal plate and the top wall of the transformer housing thereby forming a second horizontally extending air gap between the metal plate and the terminal plate and forming a third horizontally extending air gap between the terminal plate and the top wall of the transformer housing; and wherein terminals of said encapsulated transformer are mounted on said terminal plate within the wiring compartment.

2. The arrangement as claimed in claim 1, wherein the material of said insulation plate is selected from a group consisting of fiberglass, epoxy resin, bamboo, press-board paper, polymeric material, bakelite, ceramic, fabric, and a combination of these materials.

3. The arrangement as claimed in claim 2, wherein the thermal conductivity of said insulation plate ranges from 0.094 to 0.172 W/m/K.

4. The arrangement as claimed in claim 1, which includes a plurality of temperature sensors disposed on and within said transformer housing.

5. The arrangement as claimed in claim 4, wherein said temperature sensors are selected from a group consisting of thermocouples and thermistors.

6. The arrangement as claimed in claim 1, wherein said potting compound is a mixture of sand and a resin.

7. The arrangement as claimed in claim 6, wherein said resin is unsaturated polyester potting compound.

8. The arrangement as claimed in claim 1, wherein the material of said metal plate is one of steel and aluminum.

9. The arrangement as claimed in claim 1, wherein a plurality of vertically extending insulation plates are positioned around the transformer core and coil assembly and the plurality of the vertically extending insulation plates are at least partially embedded in the potting material or abut the potting material.

10. The arrangement as claimed in claim 1, wherein a second insulation plate extends beneath the transformer core and coil assembly; where the second insulation plate that extends beneath the transformer core and coil assembly is positioned above, and out of contact with, the bottom wall of the transformer housing.

* * * * *